United States Patent
Wang et al.

(10) Patent No.: US 8,436,664 B2
(45) Date of Patent: May 7, 2013

(54) CIRCUIT AND METHOD FOR IMPLEMENTING POWER GOOD AND CHIP ENABLE CONTROL BY A MULTI-FUNCTIONAL PIN OF AN INTEGRATED CIRCUIT

(75) Inventors: Jo-Yu Wang, New Taipei (TW); Isaac Y. Chen, Hsinchu County (TW)

(73) Assignee: Richtek Technology Corp., Chupei, Hsinchu (TW)

( * ) Notice: Subject to any disclaimer, the term of this patent is extended or adjusted under 35 U.S.C. 154(b) by 61 days.

(21) Appl. No.: 13/287,828

(22) Filed: Nov. 2, 2011

(65) Prior Publication Data

US 2012/0112816 A1    May 10, 2012

(30) Foreign Application Priority Data

Nov. 8, 2010 (TW) ................ 99138309 A

(51) Int. Cl.
*H03L 7/00* (2006.01)
(52) U.S. Cl.
USPC ............. 327/142; 327/143; 327/198

(58) Field of Classification Search .......... 327/142, 327/243, 198
See application file for complete search history.

(56) References Cited

U.S. PATENT DOCUMENTS

| | | | | |
|---|---|---|---|---|
| 5,203,000 A | * | 4/1993 | Folkes et al. ................. | 713/340 |
| 6,184,724 B1 | * | 2/2001 | Lin ................................ | 327/80 |
| 7,705,659 B1 | * | 4/2010 | Liu ................................ | 327/530 |

* cited by examiner

*Primary Examiner* — Lincoln Donovan
*Assistant Examiner* — Brandon S Cole
(74) *Attorney, Agent, or Firm* — Muncy, Geissler, Olds & Lowe, PLLC

(57) ABSTRACT

A first switch is switched to short a multi-functional pin of an integrated circuit to a ground terminal or let a current supplied to the multi-functional pin to flow to a second switch connected to the multi-functional pin. Before the integrated circuit is ready, the second switch is closed circuit and is detected its current to determine a first signal to enable or disable the integrated circuit. After the integrated circuit is ready, the second switch is open circuit, the voltage at the multi-functional pin is detected to determine a second signal to enable or disable the integrated circuit, and when the voltage at the multi-functional pin is higher than a threshold, a power good signal is triggered.

8 Claims, 4 Drawing Sheets

CIRCUIT AND METHOD FOR IMPLEMENTING POWER GOOD AND CHIP ENABLE CONTROL BY A MULTI-FUNCTIONAL PIN OF AN INTEGRATED CIRCUIT

FIELD OF THE INVENTION

The present invention is related generally to a multi-functional pin of an integrated circuit (IC) and, more particularly, to a circuit and method for implementing power good and chip enable control by a single pin of an IC.

BACKGROUND OF THE INVENTION

With the increase of circuits' functions, an IC requires more and more pins to implement various functions. For allowing fewer pins of an IC to implement more functions, many techniques that integrate multiple functions by a single pin of the IC have been proposed. A power good signal is an output signal of an IC that is popularly used for a system to identify whether the IC is ready for normal operation. Conventionally, a power good output function of an IC is implemented by means of an open drain or open collector structure, and the power good outputs of all the ICs in a system are connected together with a wire-or configuration. There is a pull-up resistor at the system side that is connected to the power good outputs of all the ICs in the system. When the power good outputs of all the ICs are open circuit, a power good signal will be triggered to notice the system that all the ICs are ready. If any of the power good outputs of all the ICs is short circuit to ground, no power good signals will be triggered, so the system learns that there is one or more ICs not ready yet.

As shown in FIG. 1, a conventional power converter includes an IC 10 for switching power switches M1 and M2 to convert an input voltage Vin into an output voltage Vout. The IC 10 has a multi-functional pin POK/EN for chip enable and power good control. FIG. 2 shows a circuit for the IC 10 to implement chip enable and power good control by the multi-functional pin POK/EN. Outside the IC 10, a pull-up resistor Rpull is connected between a supply voltage terminal VSB and the multi-functional pin POK/EN, and a switch SW1 is connected between the multi-functional pin POK/EN and a ground terminal GND and controlled by an enable signal EN. Inside the IC 10, a diode D2 and a switch SW2 are serially connected between the multi-functional pin POK/EN and the ground terminal GND, a comparator 12 compares the voltage at the multi-functional pin POK/EN with a threshold Vth1 to trigger a chip enable signal CE for enabling or disabling the IC 10, and a comparator 14 compares the voltage at a feedback pin FB of the IC 10 with a threshold Vth2 to trigger a power good signal PG for controlling the switch SW2. When the switch SW1 is closed circuit by the enable signal EN, the voltage at the multi-functional pin POK/EN is pulled down to the ground voltage, so the output signal CE of the comparator 12 will be logical low and thus disables the IC 10. When the switch SW1 is open circuit, the current Iok of the pull-up resistor Rpull will flow through the multi-functional pin POK/EN, the diode D2 and the switch SW2 to the ground terminal GND. Since the switch SW2, when being closed circuit, has a very small voltage drop thereacross, the diode D2 is required to have a forward bias VF large enough for the voltage at the multi-functional pin POK/EN to be higher than the threshold Vth1 so as to make the output signal CE of the comparator 12 be logical high to enable the IC 10. After the IC 10 is enabled, when the voltage at the feedback pin FB becomes higher than the threshold Vth2, indicating that the IC 10 is ready, the comparator 14 will remain the switch SW2 be open circuit. When all the ICs in a system are ready, the voltage at the multi-functional pin POK/EN will be pulled up and then a power good signal will be triggered to inform the system that all the ICs are ready.

The chip enable control and the power good control follow respective standards. Generally, the comparator 12 will trigger a chip enable signal CE for enabling the IC 10 when the voltage at the multi-functional pin POK/EN becomes higher than 0.3V, and a power good condition will be identified when the voltage at the multi-functional pin POK/EN is higher than 0.4V or 0.8V. However, the difference between 0.3V and 0.4V or 0.8V is very small and thus, due to variations of the process, voltage and temperature, it is likely that the voltage at the multi-functional pin POK/EN becomes higher than 0.4V or 0.8V before the IC 10 is really ready, thereby leading to inaccurate power good detection by the system. In addition, the resistance of the pull-up resistor Rpull also affects the voltage at the multi-functional pin POK/EN. If the pull-up resistor Rpull has a small resistance, the generated current Iok is relatively large. As a feature of a diode, the larger the current of the diode D2 is, the higher its forward bias VF is. Thus, the resistance of the pull-up resistor Rpull can not be too small; otherwise the voltage at the multi-functional pin POK/EN may incorrectly trigger a power good signal before the IC 10 is really ready. However, if the pull-up resistor Rpull has an excessively large resistance, the current Iok will be very small and thus the voltage at the multi-functional pin POK/EN will increase slowly, meaning that it will take more time to trigger a power good signal. Particularly, the more are the ICs of a system that are connected together, the slower will be the response of the entire system. In addition, in such a structure as shown in FIG. 2, since the current Iok is limited within a small range, for example 50 μA, if the diode D2 is stronger, the voltage at the multi-functional pin POK/EN may fail to be higher than the threshold Vth1, causing that the IC 10 is unable to be enabled. On the contrary, if the diode D2 is weaker, a power good signal may be incorrectly triggered before the IC 10 is ready. As discussed above, many limitations existing in the conventional circuit for implementing chip enable and power good control by a single pin of an IC make the circuit design be difficult.

SUMMARY OF THE INVENTION

An objective of the present invention is to provide a circuit for implementing chip enable and power good control by a single pin of an IC.

Another objective of the present invention is to provide a method for implementing chip enable and power good control by a single pin of an IC.

According to the present invention, a circuit for implementing chip enable and power good control by a multi-functional pin of an IC includes a current source for supplying a current to the multi-functional pin, a first switch connected between the multi-functional pin and a ground terminal, a second switch connected to the multi-functional pin, a current detector for detecting the current of the second switch to determine a first signal, a first comparator for comparing the voltage at the multi-functional pin with a first threshold to determine a second signal, a multiplexer for selecting one of the first and second signals to enable or disable the IC, and a second comparator for generating a third signal to make the second switch be open circuit when the voltage at a feedback pin of the IC is higher than a second threshold.

According to the present invention, a method for implementing chip enable and power good control by a multi-functional pin of an IC includes detection of the current of a switch connected the multi-functional pin to determine a first signal, comparison of the voltage at the multi-functional pin with a first threshold to determine a second signal, selection of the first signal to enable or disable the IC when the voltage at a feedback pin of the IC is lower than a second threshold, and control of the switch to be open circuit and selection of the second signal to enable or disable the IC when the voltage at the feedback pin is higher than the second threshold.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
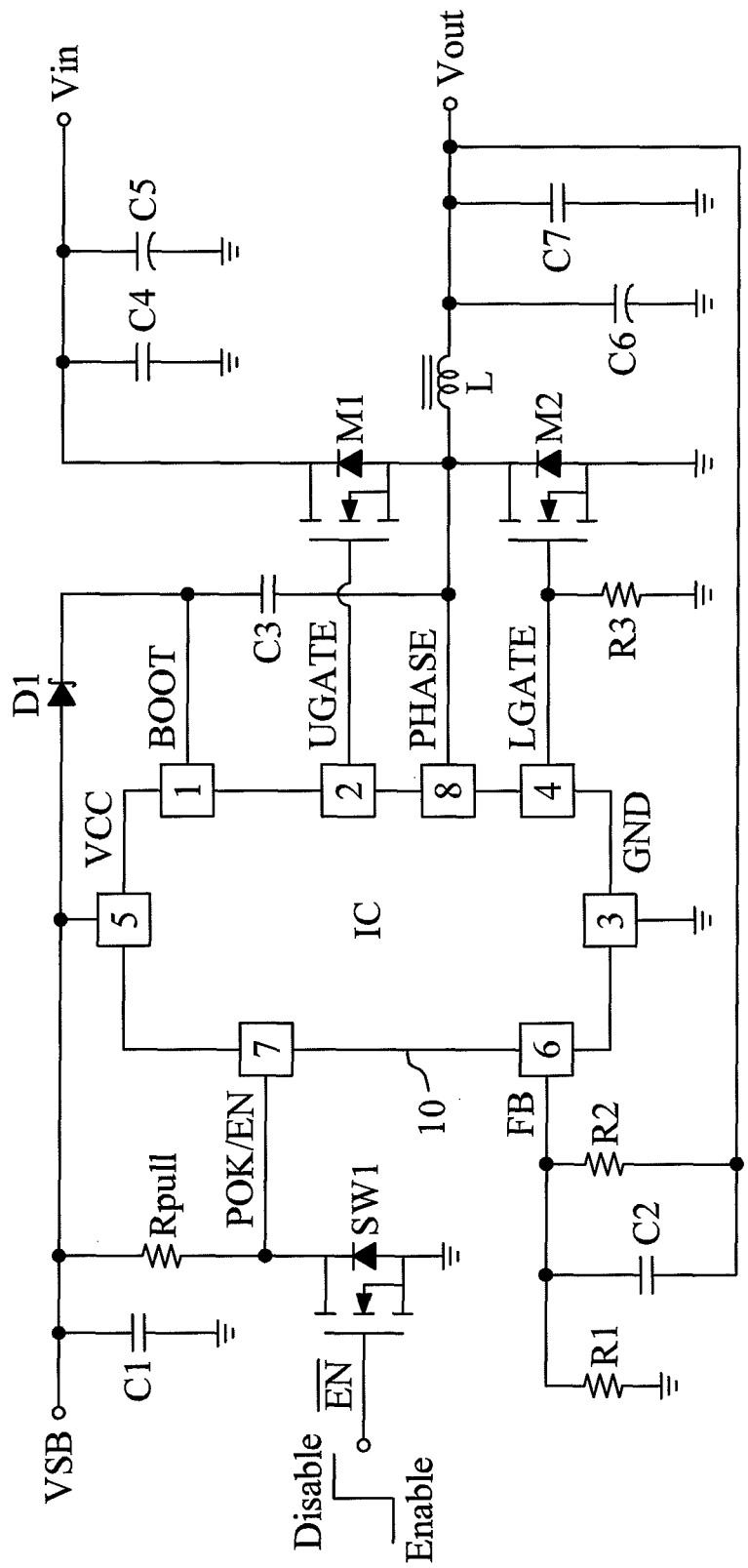
FIG. 1 is a circuit diagram of a conventional power converter.
Figure 2:
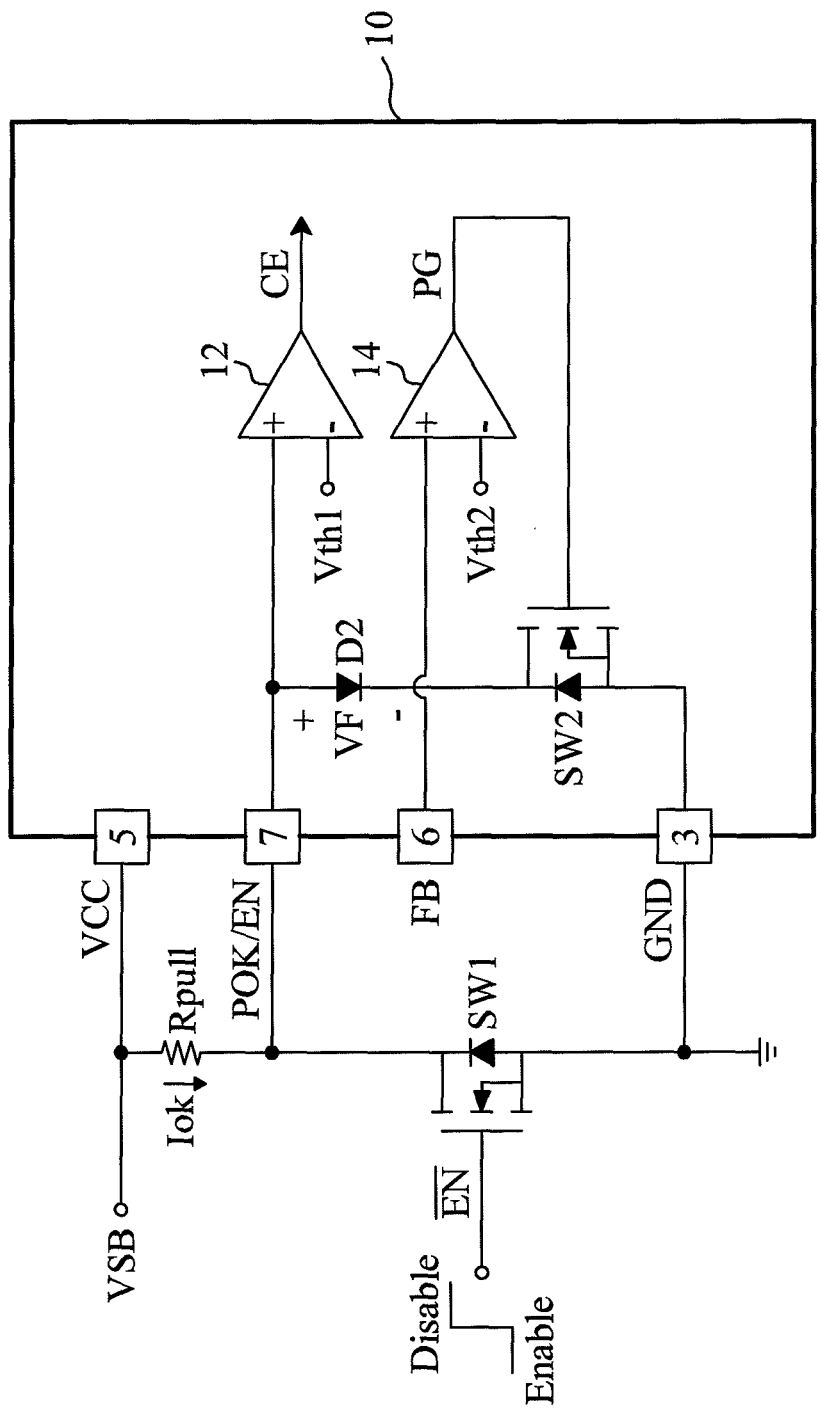
FIG. 2 is a circuit for the IC shown in FIG. 1 to implement chip enable and power good control by a multi-functional pin.
Figure 3:
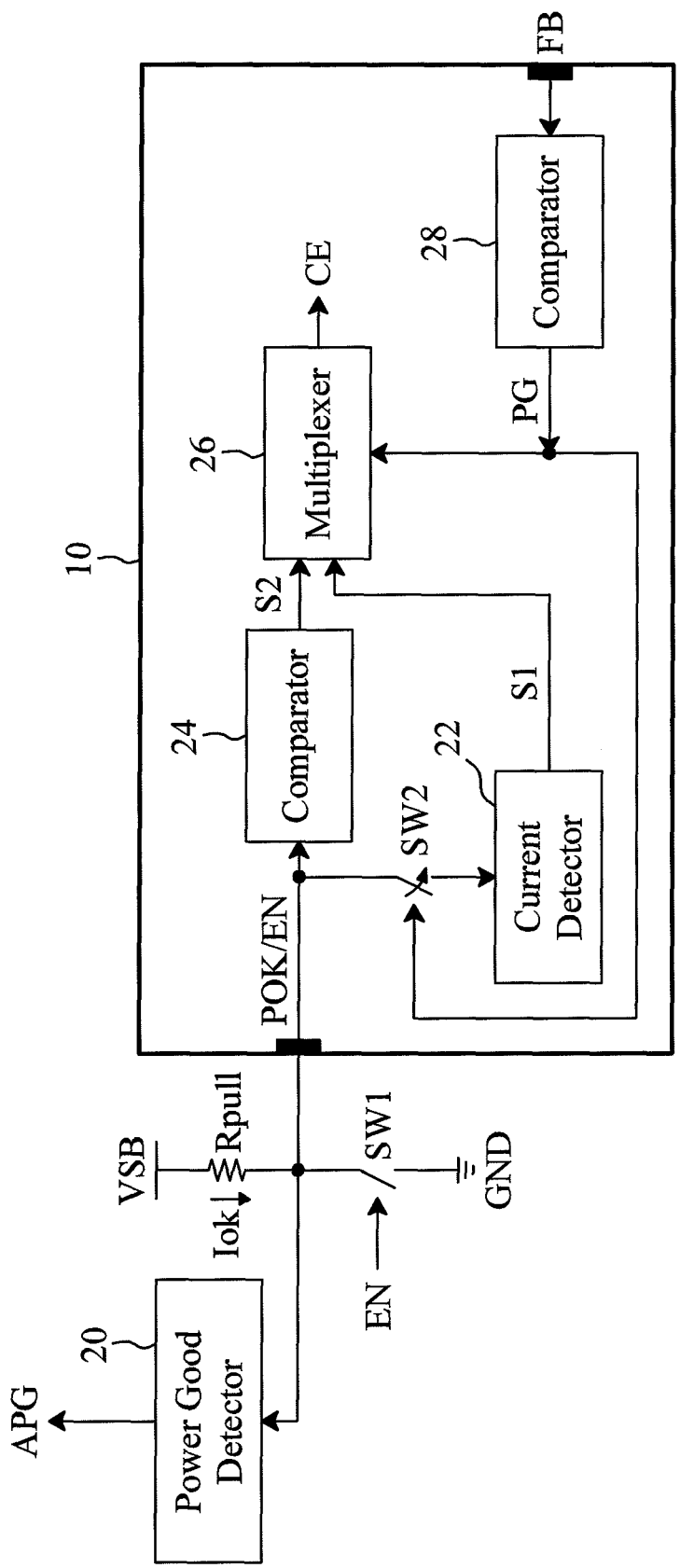
FIG. 3 is a circuit diagram of an embodiment according to the present invention.

FIG. 3 is a circuit diagram of an embodiment according to the present invention, in which a pull-up resistor Rpull is connected between a supply voltage terminal VSB and a multi-functional pin POK/EN of an IC 10 for acting as a current source to supply a current Iok to the multi-functional pin POK/EN, a switch SW1 outside the IC 10 is connected between the multi-functional pin POK/EN and a ground terminal GND and controlled by an enable signal EN, a power good detector 20 is connected to the multi-functional pin POK/EN to trigger a power good signal APG according to the voltage at the multi-functional pin POK/EN for informing a system, a switch SW2 inside the IC 10 is connected to the multi-functional pin POK/EN and controlled by a power good signal PG, a current detector 22 is connected to the switch SW2 to detect the current of the switch SW2 to determine a signal S1, a comparator 24 is connected to the multi-functional pin POK/EN to determine a signal S2 according to the voltage at the multi-functional pin POK/EN, a multiplexer 26 is connected to the current detector 22 and the comparator 24 to select one of the signals S1 and S2 according to the power good signal PG as a chip enable signal CE for enabling or disabling the IC 10, and a comparator 28 determines the power good signal PG according to the voltage at a feedback pin FB of the IC 10 for controlling the switch SW2 and the multiplexer 26.

Figure 4:
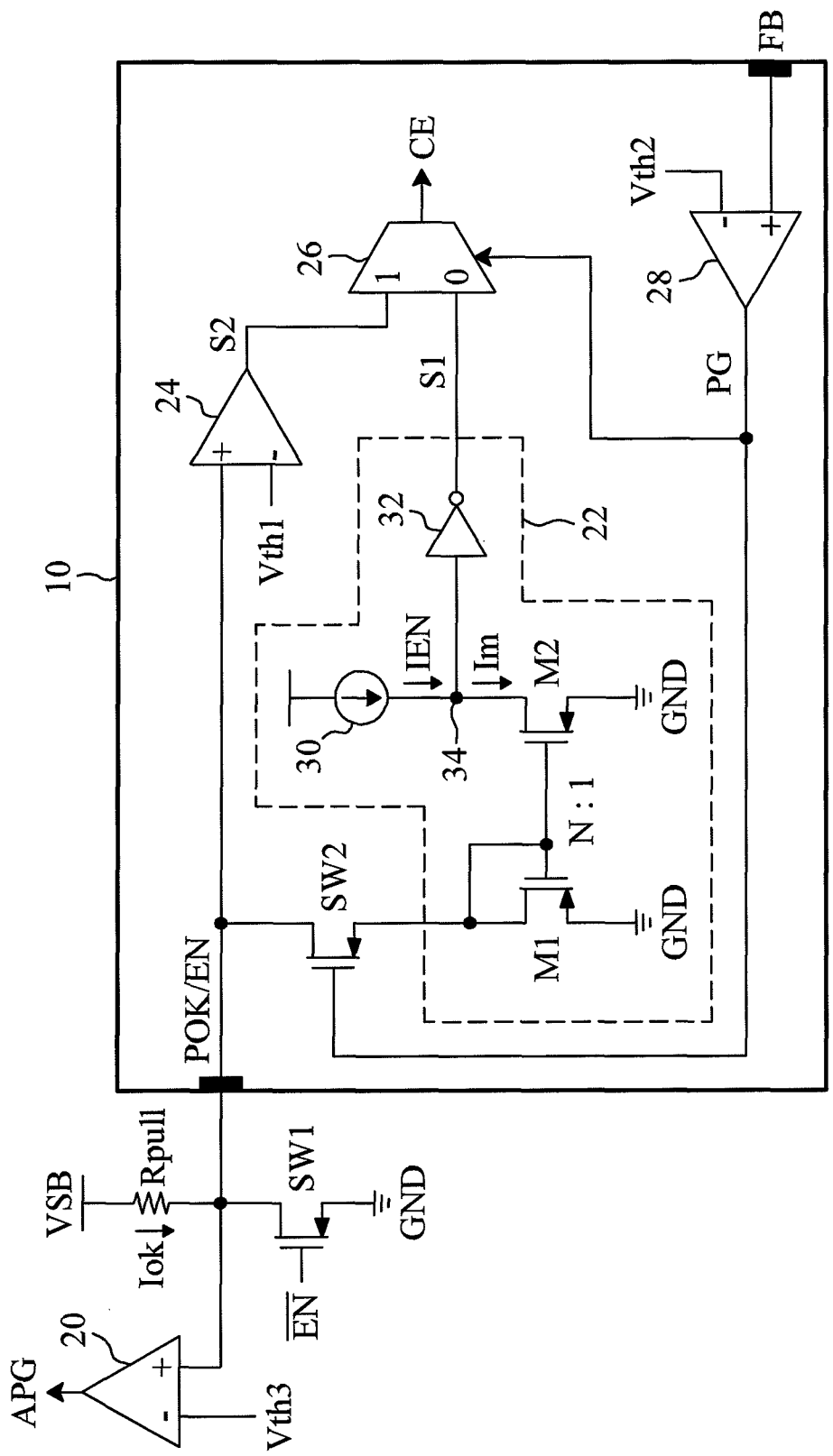
FIG. 4 is a circuit diagram of an embodiment for the circuit shown in FIG. 3.

FIG. 4 is a circuit diagram of an embodiment for the circuit shown in FIG. 3, in which each of the switches SW1 and SW2 is a MOS transistor, the power good detector 20 is a comparator that compares the voltage at the multi-functional pin POK/EN with a threshold Vth3, and triggers the power good signal APG once the voltage at the multi-functional pin POK/EN becomes higher than the threshold Vth3, the current detector 22 includes a current mirror established by transistors M1 and M2 that have a size ratio of N:1, and connected to the switch SW2 for mirroring the current of the switch SW2 to generate a mirror current Im to be compared with a reference current IEN provided by a current source 30, and an inverter 32 connected to an output terminal 34 of the current mirror for generating the signal S1 according to the voltage at the output terminal 34. When the mirror current Im is smaller than the reference current IEN, the voltage at the output terminal 34 will be high, causing the inverter 32 to generate a logical low signal S1. When the mirror current Im is larger than the reference current IEN, the voltage at the output terminal 34 will be low, causing the inverter 32 to generate a logical high signal S1.

Before the IC 10 starts up, the switch SW1 is closed circuit and the voltage at the feedback pin FB is lower than the threshold Vth2, so the output signal PG of the comparator 28 is logical low and thus makes the switch SW2 be closed circuit and the multiplexer 26 select the signal S1 as its output CE. At this time, almost all of the current Iok flows to the ground terminal GND through the switch SW1 and almost no current flows through the switch SW2. As a result, the mirror current Im is smaller than the reference current IEN, and the signal S1 is logical low and thus unable to enable the IC 10. Then, when the enable signal EN makes the switch SW1 be open circuit, the current Iok supplied to the multi-functional pin POK/EN will flow through the multi-functional pin POK/EN, the switch SW2 and the transistor M1 to the ground terminal GND. Therefore, the mirror current Im becomes larger than the reference current IEN, causing the signal S1 to turn to logical high to enable the IC 10. In this embodiment, the current of the switch SW2 is divided by N by the current mirror for comparison with the reference current IEN, so the current Iok flowing through the pull-up resistor Rpull must not be too small. Assuming that the reference current IEN is 10 μA, the current Iok will be about 1 mA-10 mA. After the IC 10 is enabled, the voltage at the feedback pin FB increases, and when the voltage at the feedback pin FB becomes higher than the threshold Vth2, indicating that the IC 10 is ready, the output signal PG of the comparator 28 will turn to logical high to make the switch SW2 be open circuit and the multiplexer 26 select the signal S2 as its output CE. During the period where the switch SW2 is open circuit, if there is one or more other ICs in the same system not ready yet, the voltage across the switch SW2 and the transistor M1 of the unready IC will make the voltage at the multi-functional pin POK/EN of the ready IC 10 higher than the threshold Vth1 yet lower than the threshold Vth3, so the output signal S2 of the comparator 24 in the ready IC 10 will be logical high to remain the ready IC 10 enabled. Generally, the threshold Vth1 is about 0.3V, and the threshold Vth3 is about 0.8V. When the other ICs are all ready, the current Iok will make the voltage at the multi-functional pin POK/EN increase, and once the voltage at the multi-functional pin POK/EN becomes higher than the threshold Vth3, the power good detector 20 will trigger a logical high signal APG to inform the system that all the ICs are ready. The current Iok used in the circuit according to the present invention is larger than that of the conventional circuit, so it allows more ICs to be connected together in a system, and facilitates improving the response of the system.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for implementing chip enable and power good control by a multi-functional pin of an integrated circuit, comprising:

a current source connected to the multi-functional pin, supplying a current to the multi-functional pin;

a first switch connected between the multi-functional pin and a ground terminal, switched by an enable signal;

a second switch connected to the multi-functional pin;

a current detector connected to the second switch, detecting a current of the second switch to determine a first signal;

a first comparator connected to the multi-functional pin, comparing a voltage at the multi-functional pin with a first threshold to determine a second signal;

a multiplexer connected to the current detector and the first comparator, selecting one of the first and second signals to enable or disable the integrated circuit; and a second comparator connected to the second switch and a feedback pin of the integrated circuit, generating a third signal to make the second switch be open circuit when a voltage at the feedback pin is higher than a second threshold.

2. The circuit of claim 1, further comprising a third comparator connected to the multi-functional pin, comparing the voltage at the multi-functional pin with a third threshold for triggering a power good signal when the voltage at the multi-functional pin becomes higher than the third threshold after the second switch becomes open circuit.

3. The circuit of claim 1, wherein the current source comprises a pull-up resistor connected between a supply voltage terminal and the multi-functional pin.

4. The circuit of claim 1, wherein the current detector comprises:

a current mirror connected to the second switch, mirroring the current of the second switch to generate a mirror current; and a current source connected to the current mirror, providing a reference current to be compared with the mirror current to generate the first signal.

5. The circuit of claim 1, wherein the multiplexer is connected to the second comparator and selects the first signal or the second signal according to the third signal.

6. A method for implementing chip enable and power good control by a multi-functional pin of an integrated circuit, comprising the steps of:

(A) detecting a current of a switch connected to the multi-functional pin for determining a first signal;

(B) comparing a voltage at the multi-functional pin with a first threshold for determining a second signal;

(C) selecting the first signal to enable or disable the integrated circuit when a voltage at a feedback pin of the integrated circuit is lower than a second threshold; and (D) controlling the switch to be open circuit and selecting the second signal to enable or disable the integrated circuit when the voltage at the feedback pin is higher than the second threshold.

7. The method of claim 6, wherein the step A comprises the steps of:

mirroring the current of the second switch for generating a mirror current; and comparing the mirror current with a reference current for generating the first signal.

8. The method of claim 6, further comprising the steps of:

comparing the voltage at the multi-functional pin with a third threshold; and triggering a power good signal when the voltage at the multi-functional pin becomes higher than the third threshold.

\* \* \* \* \*